US012598817B2

(12) United States Patent
Koestler et al.

(10) Patent No.: US 12,598,817 B2
(45) Date of Patent: Apr. 7, 2026

(54) STACKED III-V MULTI-JUNCTION SOLAR CELL

(71) Applicant: AZUR SPACE Solar Power GmbH, Heilbronn (DE)

(72) Inventors: Wolfgang Koestler, Heilbronn (DE); Benjamin Hagedorn, Ilsfeld (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 18/770,377

(22) Filed: Jul. 11, 2024

(65) Prior Publication Data

US 2025/0022977 A1 Jan. 16, 2025

(30) Foreign Application Priority Data

Jul. 11, 2023 (DE) ..................... 10 2023 002 829.0

(51) Int. Cl.
*H10F 10/142* (2025.01)
*H10F 77/20* (2025.01)

(52) U.S. Cl.
CPC ......... *H10F 10/142* (2025.01); *H10F 77/211* (2025.01)

(58) Field of Classification Search
CPC .............................. H10F 10/142; H10F 77/211
See application file for complete search history.

(56) References Cited

U.S. PATENT DOCUMENTS

| | | | |
|---|---|---|---|
| 9,680,035 B1 | 6/2017 | Chary et al. | |
| 2006/0162767 A1* | 7/2006 | Mascarenhas | ........ H10F 10/142 |
| | | | 136/261 |
| 2008/0185038 A1 | 8/2008 | Sharps | |
| 2021/0066517 A1* | 3/2021 | Koestler | ............... H10F 77/311 |
| 2021/0159349 A1* | 5/2021 | Koestler | ................ H10F 71/00 |

FOREIGN PATENT DOCUMENTS

| | | |
|---|---|---|
| DE | 102021004707 A1 | 9/2022 |
| EP | 1953828 A1 | 8/2008 |

* cited by examiner

*Primary Examiner* — Mayla Gonzalez Ramos
(74) *Attorney, Agent, or Firm* — Muncy, Geissler, Olds & Lowe, P.C.

(57) ABSTRACT

A stacked III-V multi-junction solar cell with a top and a bottom. A metallic top contact area is formed at the top and has a first layer of metal, a flat metallic bottom contact area formed on the bottom. An opening extends continuously from the top to the bottom and has an upper edge area formed at the top and a lower edge area formed at the bottom. The upper edge area is adjacent to the top contact area and the side wall and the two edge areas are covered with a dielectric layer. The dielectric layer has a top and a bottom. A first metallic top layer is formed on a surface of the first metal layer and on the top of the dielectric layer and a second metallic top layer is formed on a part of the first metal layer adjacent to the upper edge area.

19 Claims, 1 Drawing Sheet

STACKED III-V MULTI-JUNCTION SOLAR CELL

This nonprovisional application claims priority under 35 U.S.C. § 119(a) to German Patent Application No. 10 2023 002 829.0, which was filed in Germany on Jul. 11, 2023, and which is herein incorporated by reference.

BACKGROUND OF THE INVENTION

Field of the Invention

The present invention relates to a stacked III-V multi-junction solar cell

Description of the Background Art

From U.S. Pat. No. 9,680,035 B1, a solar cell contact assembly with a solar cell stack comprising several III-V subcells on a GaAs substrate with back-contacted front is known. In this case, a hole extending from the top of the solar cell through the subcells into a substrate layer that has not yet been thinned is created by a wet chemical etching process. Passivation and metallization of the front and hole is carried out before thinning the substrate layer.

SUMMARY OF THE INVENTION

It is therefore an object of the invention to provide a device which advances the state of the art.

According to an example of the invention, a stacked III-V multi-junction solar cell is provided, with the III-V multi-junction solar cell having a top and a bottom.

A substrate layer is formed on the bottom. Above the substrate layer is a first solar cell with a first band gap.

Above the first solar cell can be a second solar cell with a second band gap, with the second band gap being larger than the first band gap.

A tunnel diode can be formed between the first solar cell and the second solar cell.

The multi-junction solar cell can comprise a metallic top contact area with a first metal layer on the top.

In order to connect the substrate electrically, a flat metallic bottom contact area can be provided on the bottom of the multi-junction solar cell, wherein the multi-junction solar cell is electrically connected by means of the top contact area and the bottom contact area.

A continuous oval opening can extend from the top to the bottom.

The oval opening can have a circumferential side wall and an upper edge area formed at the top and a lower edge area formed at the bottom, wherein the upper edge area is adjacent to the top contact area.

It should be noted that the oval opening can have a diameter in a range between 10 μm and 300 μm or in a range between 50 μm around 150 μm.

The oval opening can also be exactly circular, i.e., has a constant radius.

The side wall and the two edge areas can be completely covered with a dielectric layer, wherein the dielectric layer has a top and a bottom.

The dielectric layer can include a silicon oxide, in particular a silicon dioxide, and/or a silicon nitride. Alternatively, the dielectric layer consists of silicon oxide, in particular silicon dioxide and/or silicon nitride. In a further development, the thickness of the dielectric layer is in a range between 5 nm and 500 nm or in a range between 50 nm and 200 nm.

The dielectric layer can be applied by a deposition process. In particular, by a CVD or ALD technique.

Furthermore, the dielectric layer can form a material-tight bond with a semiconductor material in the area of the side wall and in the top and bottom edge areas.

A first metallic top layer can be formed on a surface of the first metal layer, wherein the first metallic top layer has a thickness in a range between 5 nm and 300 nm, or a thickness in a range between 10 nm and 200 nm or a thickness in a range between 20 nm and 100 nm.

On the top of the dielectric layer and on a part of the first metal layer adjacent to the upper edge area, a second metallic top layer can be formed, wherein the second metallic top layer has a thickness in a range between 10 nm and 100 nm, or a thickness in a range between 20 nm and 50 nm.

On the second metallic top layer, a second layer of metal can be arranged in the part adjacent to the upper edge area and the upper edge area and in the area of the side wall adjacent to the upper edge area.

The second metal layer can form a material-tight bond with the second metallic top layer. Here, the metallic top layer includes titanium or a titanium compound and/or includes nickel or a nickel compound. In a further development, the metallic cover layer can be formed of titanium or a titanium compound and/or nickel or a nickel compound.

Furthermore, the respective metal layers can be designed as conductor tracks, wherein the metal layers can both have a finger-shaped and a flat formation in a further development.

The III-V solar cells can be used in the field of extraterrestrial applications. Reliable electrical contacting is particularly important for extraterrestrial applications.

An advantage is that the metallic top layers allow for the metal layers on the surfaces to be passivated well. The metallic top layers have no gold or silver and no gold and/or silver compounds. Because the metallic top layers have titanium or nickel or compounds of titanium and/or nickel, different metal layers can be formed on top of each other reliably and durably. It is understood that the second metal layer cannot be formed immediately after the first metal layer.

The III-V multi-junction solar cell can have a thickness in a range between 50 μm and 600 μm or in a range between 100 μm and 250 μm.

A layered compound of titanium and oxygen and/or nitrogen can be formed between the second metallic top layer and the dielectric layer. In the following, the layered compound is also referred to as the adhesive layer. One advantage is that the adhesive layer increases the reliability of the connection and improves chipping or cracking of the second metallic top layer.

The thickness of the metallic top layer can be in a range between 2 nm and 30 nm, or in a range between 3 nm and 10 nm or in a range between 4 nm and 7 nm.

A third metallic top layer can be formed on a surface of the second metal layer.

A fourth metallic surface layer can be formed on the lower edge area and on the area of the side wall adjacent to the lower edge area and on a part of the second metal layer formed on the side wall. In addition to passivating and protecting the second metal layer, the fourth metallic surface layer improves adhesion when a third metal layer is applied to the second metal layer. In other words, when the third layer of metal is applied, the arrangement of the fourth layer of metal allows for a reliable and low-impedance bond to be formed between two layers of metal.

A third metal layer can be formed on the fourth metallic surface layer, wherein the third metal layer extends continuously from the lower edge area and the part of the side wall adjacent to the lower edge area to the part of the second metal layer covered by the fourth metallic surface layer. In this case, the third metal layer forms a material-tight bond with the respective substrate.

The lower edge area can be spaced from the bottom contact area.

A contact surface can be formed in the lower edge area with the third metal layer. In other words, the third metal layer can be at least partly formed as a contact layer for the electrical connection of the III-V multi-junction cell.

The bottom contact area can have a fourth metal layer. In an example, the third metal layer and the fourth metal layer can be formed in a common process step or different process steps.

Another metallic top layer can be formed on a surface of the fourth metal layer. An advantage is that the reliability of the contacting is increased by means of the additional metallic top layer.

The top contact area can be electrically connected to the contact surface on the bottom by means of the second metal layer and the third metal layer. In other words, the front of the III-V multi-junction solar cell can be contacted from the back, i.e., electrically connected. This simplifies the electrical contacting of the III-V multi-junction solar cell.

The side wall can be completely covered all around with the second metal layer and the third metal layer. It should be noted that in order to achieve complete coverage of the side wall, both metal layers are necessary.

The opening can have a clear width after the metal layers have been applied.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION

Figure 1:
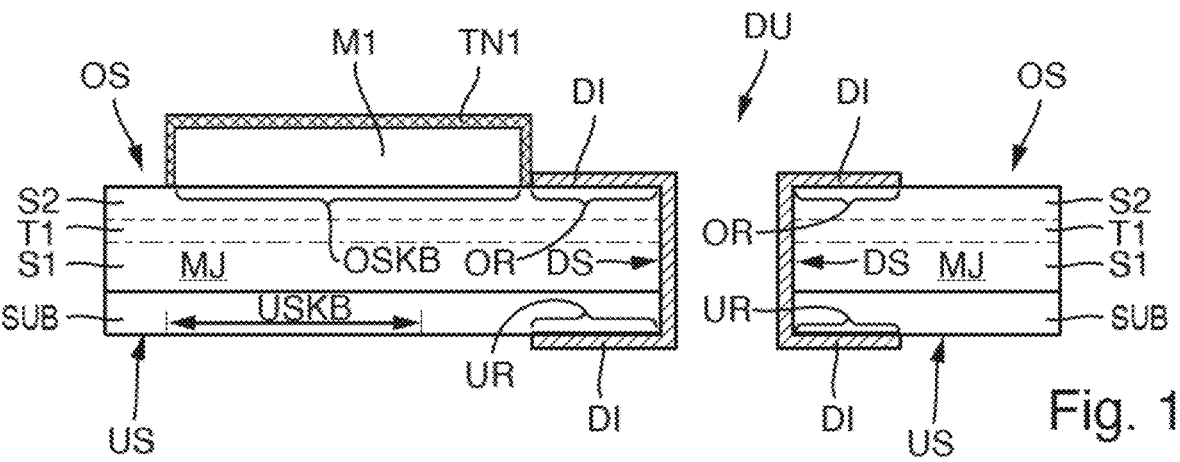
FIG. 1 shows a view of a stacked III-V multi-junction solar cell with a passage opening.

FIG. 1 shows a view of an example comprising a stacked III-V multi-junction solar cell MJ with a top OS and a bottom US.

The stacked III-V multi-junction solar cell MJ comprises a substrate layer SUB formed on the bottom US with a first solar cell S1 arranged above the substrate layer SUB with a first band gap and a second solar cell S2 arranged above the first solar cell S1 with a second band gap, wherein the second band gap is larger than the first band gap.

Between the first solar cell S1 and the second solar cell S2, a tunnel diode T1 is formed.

At the top side of the multi-junction solar cell MJ a metallic top contact area OSKB is formed, wherein the top contact area OSKB comprises a first metal layer M1.

In order to electrically connect the substrate SUB, a flat metallic bottom contact area USKB is arranged on the bottom US of the multi-junction solar cell MJ.

By means of the top contact area OSKB and the bottom contact area USKB, the multi-junction solar cell MJ is electrically connected.

From the top OS to the bottom US, a continuous oval opening DU extends.

The opening DU has a circumferential side wall DS and an upper edge area OR formed on the top OS and a lower edge area UR formed on the bottom US.

Here, the upper edge area OR borders on the top contact area OSKB.

In addition, the side wall DS and the two edge areas OR, UR are completely covered with a dielectric layer DI, wherein the dielectric layer DI has an upper and a lower side.

Furthermore, the dielectric layer DI on the bottom in the area of the side wall DI forms a material-tight bond with a semiconductor material.

On a surface of the first metal layer M1, a first metallic top layer TN1 is formed, wherein the first metallic top layer TN1 has a thickness in a range between 5 nm and 300 nm.

Figure 2:
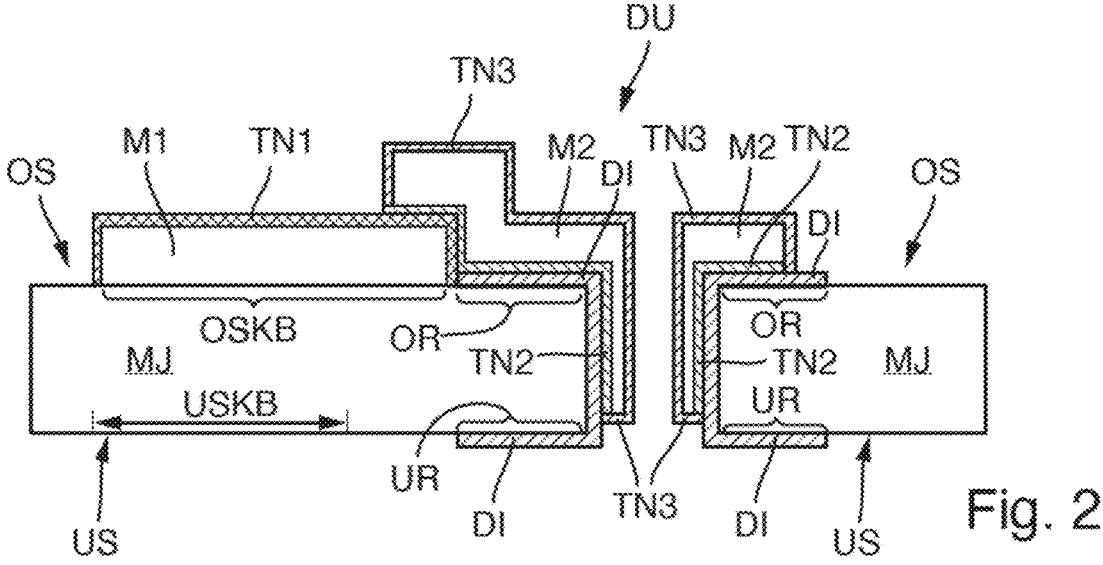
FIG. 2 shows a view of a further development of the example shown in FIG. 1.

The illustration of FIG. 2 shows a further development of the example of FIG. 1. In the following, only the differences are explained.

On the top of the dielectric layer DI and on a part of the first metal layer M1 adjacent to the upper edge area OR, a second metallic surface layer TN2 is formed.

The second metallic top layer TN2 preferably has a thickness in a range between 10 nm and 100 nm.

On the second metallic surface layer TN2, a second metal layer M2 is arranged on the part adjacent to the upper edge area OR and the upper edge area OR and in the area of the side wall DS adjacent to the upper edge area OR.

The second metal layer M2 forms a material-tight bond with the second metallic top layer TN2.

A compound of titanium and oxygen is formed between the second metallic top layer TN2 and the dielectric layer DI. It is understood that the connection is layered.

Figure 3:
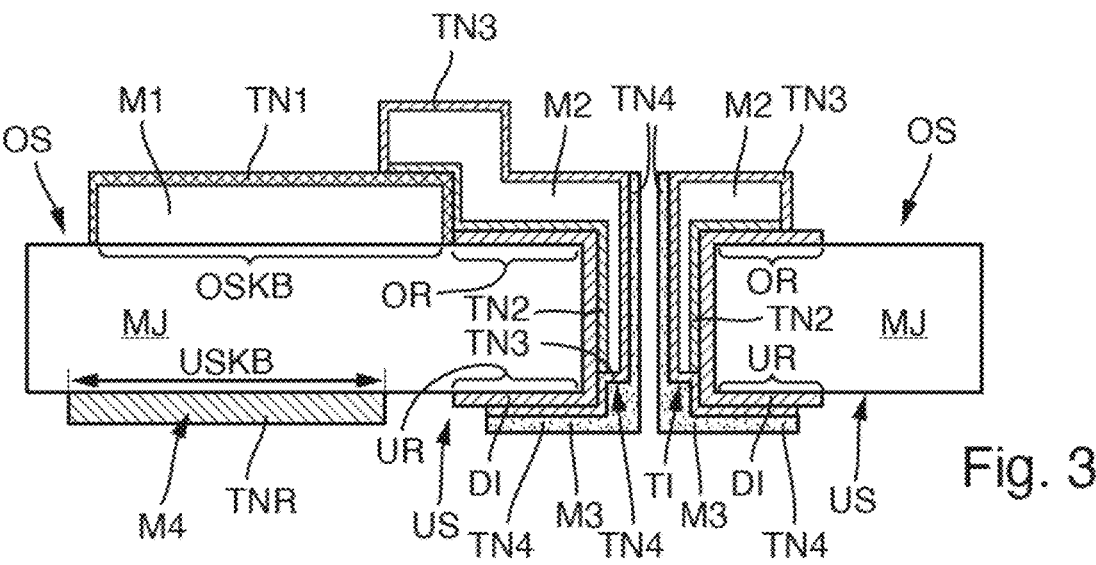
FIG. 3 shows a view of a further development of the example shown in FIG. 2.

FIG. 3 shows another example. In the following, only the differences to the example of FIG. 2 are explained.

On the surface of the second metal layer M2, a third metallic top layer TN3 is formed.

Furthermore, a fourth metallic top layer TN4 is formed on the lower edge area UR and on the area of the side wall DS adjacent to the lower edge area UR and a part of the second metal layer M2 formed on the side wall DS.

A third metal layer M3 is formed on the fourth metallic top layer TN4 and the third metal layer M3 extends continuously from the lower edge area UR and the part of the side wall DS adjacent to the lower edge area UR to the part of the second metal layer M2 covered by the fourth metallic top layer TN4.

In addition, the third metal layer M3 forms a material-tight bond with the substrate.

The lower edge area UR is spaced from the bottom contact area USKB.

In the lower edge area UR, a contacting surface is formed with the third metal layer M3.

The bottom contact area USKB has a fourth metal layer M4 and a further metallic surface layer TNR is formed on a surface of the fourth metal layer M4.

In addition, the top contact area OSKB is electrically connected to the contact surface on the bottom US by means of the second metal layer M2 and the third metal layer M3.

In addition, the side wall DS is completely covered all around with the second metal layer M2 and the third metal layer M3.

Furthermore, the opening DU has a clear width after applying the metal layers M1-M4.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V multi-junction solar cell comprising:
a substrate layer formed on a bottom of the multi-junction solar cell;
a first solar cell arranged above the substrate layer with a first band gap;
a second solar cell arranged above the first solar cell with a second band gap, the second band gap being larger than the first band gap;
a tunnel diode formed between the first solar cell and the second solar cell;
a metallic top contact area formed at a top of the multi-junction solar cell, the top contact area comprising a first metal layer;
a flat metallic bottom contact area to electrically connect the substrate, the multi-junction solar cell being electrically connected via the top contact area and the bottom contact area;
an oval opening extending continuously from the top to the bottom of the multi-junction solar cell, the opening having a circumferential side wall and an upper edge area formed on the top and a lower edge area formed on the bottom, the upper edge area being adjacent to the top contact area, the side wall and the two edge areas being completely covered with a dielectric layer, the dielectric layer having a top and a bottom and the dielectric layer forming a material-tight bond with a semiconductor material on the bottom in an area of the side wall;
a first metallic top layer formed on a surface of the first metal layer, the first metallic top layer having a thickness in a range between 5 nm and 300 nm;
a second metallic top layer formed on the top of the dielectric layer and on a part of the first metal layer adjacent to the upper edge area, the second metallic top layer having a thickness in a range between 10 nm and 100 nm; and
a second metal layer arranged on the second metallic top layer in a part adjacent to the upper edge area, the upper edge area and in an area of the side wall adjacent to the upper edge area, the second metal layer forming a material-tight bond with the second metallic top layer, wherein the first metallic top layer is formed over a top surface and each side surface of the first metal layer.

2. The stacked III-V multi-junction solar cell according to claim 1, wherein a layered compound of titanium and oxygen and/or nitrogen is formed between the second metallic top layer and the dielectric layer.

3. The stacked III-V multi-junction solar cell according to claim 1, wherein a third metallic top layer is formed on a surface of the second metal layer.

4. The stacked III-V multi-junction solar cell according to claim 1, wherein a fourth metallic top layer is formed on the lower edge area and on the area of the side wall adjacent to the lower edge area and on a part of the second metal layer formed on the side wall.

5. The stacked III-V multi-junction solar cell according to claim 4, wherein a third metal layer is formed on the fourth metallic top layer and the third metal layer extends continuously from the lower edge area and the part of the side wall adjacent to the lower edge area to the part of the second metal layer covered by the fourth metallic top layer, and wherein the third metal layer forms a material-tight bond with the respective substrate.

6. The stacked III-V multi-junction solar cell according to claim 1, wherein the lower edge area is spaced from the bottom contact area.

7. The stacked III-V multi-junction solar cell according to claim 5 wherein a contact surface is formed in the lower edge area with the third metal layer.

8. The stacked III-V multi-junction solar cell according to claim 1, wherein the bottom contact area comprises a fourth metal layer and a further metallic top layer is formed on a surface of the fourth metal layer.

9. The stacked III-V multi-junction solar cell according to claim 5, wherein the top contact area is electrically connected to the contact surface on the bottom by the second metal layer and the third metal layer.

10. The stacked III-V multi-junction solar cell according to claim 5 wherein the side wall is completely covered all around with the second metal layer and the third metal layer.

11. The stacked III-V multi-junction solar cell according to claim 1, wherein the opening has a clear width after applying the metal layers.

12. The stacked III-V multi-junction solar cell according to claim 1, wherein the metallic top layers are formed as a titanium layer or as a nickel layer, or at least comprise titanium and/or nickel.

13. The stacked III-V multi-junction solar cell according to claim 1, wherein the dielectric layer directly contacts a top surface of the second solar cell in the upper edge area.

14. The stacked III-V multi-junction solar cell according to claim 1, wherein the first metallic top layer surrounds the first metal layer.

15. A stacked III-V multi-junction solar cell comprising:
a substrate layer formed on a bottom of the multi-junction solar cell;
a first solar cell arranged above the substrate layer with a first band gap;
a second solar cell arranged above the first solar cell with a second band gap, the second band gap being larger than the first band gap;
a tunnel diode formed between the first solar cell and the second solar cell;
a metallic top contact area formed at a top of the multi-junction solar cell, the top contact area comprising a first metal layer;
a flat metallic bottom contact area to electrically connect the substrate, the multi-junction solar cell being electrically connected via the top contact area and the bottom contact area;
an oval opening extending continuously from the top to the bottom of the multi-junction solar cell, the opening having a circumferential side wall and an upper edge area formed on the top and a lower edge area formed on the bottom, the upper edge area being adjacent to the top contact area, the side wall and the two edge areas being completely covered with a dielectric layer, the dielectric layer having a top and a bottom and the dielectric layer forming a material-tight bond with a semiconductor material on the bottom in an area of the side wall;

a first metallic top layer formed on a surface of the first metal layer, the first metallic top layer having a thickness in a range between 5 nm and 300 nm;

a second metallic top layer formed on the top of the dielectric layer and on a part of the first metal layer adjacent to the upper edge area, the second metallic top layer having a thickness in a range between 10 nm and 100 nm; and a second metal layer arranged on the second metallic top layer in a part adjacent to the upper edge area, the upper edge area and in an area of the side wall adjacent to the upper edge area, the second metal layer forming a material-tight bond with the second metallic top layer, wherein the first metallic top layer covers an entirety of a top surface and each side surface of the first metal layer.

16. The stacked III-V multi-junction solar cell according to claim 15, wherein the first metallic top layer directly contacts the top surface and each side surface of the first metal layer.

17. The stacked III-V multi-junction solar cell according to claim 1, wherein the first metallic top layer is physically separate from the second metallic top layer.

18. The stacked III-V multi-junction solar cell according to claim 1, wherein the dielectric layer forms a material-tight bond with the semiconductor material in the upper edge area and the bottom edge area.

19. A stacked III-V multi-junction solar cell comprising:

a substrate layer formed on a bottom of the multi-junction solar cell;

a first solar cell arranged above the substrate layer with a first band gap;

a second solar cell arranged above the first solar cell with a second band gap, the second band gap being larger than the first band gap;

a tunnel diode formed between the first solar cell and the second solar cell;

a metallic top contact area formed at a top of the multi-junction solar cell, the top contact area comprising a first metal layer;

a flat metallic bottom contact area to electrically connect the substrate, the multi-junction solar cell being electrically connected via the top contact area and the bottom contact area;

an oval opening extending continuously from the top to the bottom of the multi-junction solar cell, the opening having a circumferential side wall and an upper edge area formed on the top and a lower edge area formed on the bottom, the upper edge area being adjacent to the top contact area, the side wall and the two edge areas being completely covered with a dielectric layer, the dielectric layer having a top and a bottom and the dielectric layer forming a material-tight bond with a semiconductor material on the bottom in an area of the side wall;

a first metallic top layer formed on a surface of the first metal layer, the first metallic top layer having a thickness in a range between 5 nm and 300 nm;

a second metallic top layer formed on the top of the dielectric layer and on a part of the first metal layer adjacent to the upper edge area, the second metallic top layer having a thickness in a range between 10 nm and 100 nm; and a second metal layer arranged on the second metallic top layer in a part adjacent to the upper edge area, the upper edge area and in an area of the side wall adjacent to the upper edge area, the second metal layer forming a material-tight bond with the second metallic top layer, wherein the second metallic top layer and the second metal layer are formed only partially along the side wall and do not extend to a bottom of the side wall.

* * * * *